(12) United States Patent
Lee et al.

(10) Patent No.: US 10,219,377 B2
(45) Date of Patent: Feb. 26, 2019

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Hyo-chul Lee, Asan-si (KR); Hyunseok Hong, Asan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 63 days.

(21) Appl. No.: 15/210,370

(22) Filed: Jul. 14, 2016

(65) Prior Publication Data

US 2017/0135213 A1    May 11, 2017

(30) Foreign Application Priority Data

Nov. 6, 2015   (KR) .................. 10-2015-0155941

(51) Int. Cl.
| | |
|---|---|
| *G09G 3/20* | (2006.01) |
| *H05K 1/11* | (2006.01) |
| *H05K 1/14* | (2006.01) |
| *H05K 3/24* | (2006.01) |
| *H05K 3/36* | (2006.01) |
| *G02F 1/1333* | (2006.01) |

(52) U.S. Cl.
CPC .......... *H05K 1/147* (2013.01); *G02F 1/1333* (2013.01); *G09G 3/2092* (2013.01); *H05K 1/111* (2013.01); *H05K 3/24* (2013.01); *H05K 3/361* (2013.01); *H05K 3/363* (2013.01); *G09G 2310/027* (2013.01); *H05K 2201/058* (2013.01); *H05K 2201/10128* (2013.01)

(58) Field of Classification Search
CPC ........... G09G 3/2092; G09G 2310/027; G02F 1/1333; H05K 1/147; H05K 1/111; H05K 3/361; H05K 3/363; H05K 3/24; H05K 2201/10128; H05K 2201/058; H05K 2201/052
See application file for complete search history.

(56) References Cited

U.S. PATENT DOCUMENTS

2006/0220991 A1* 10/2006 Lee ..................... G02F 1/13452
345/52
2008/0094328 A1* 4/2008 Ishiyama ............. G09G 3/3666
345/87

(Continued)

FOREIGN PATENT DOCUMENTS

| KR | 1020040100756 A | 12/2004 |
|---|---|---|
| KR | 1020110028124 A | 3/2011 |

*Primary Examiner* — Srilakshmi K Kumar
*Assistant Examiner* — Brent D Castiaux
(74) *Attorney, Agent, or Firm* — Cantor Colburn LLP

(57) ABSTRACT

A display device includes a display panel having a first area and a second area that is adjacent to the first area in a first direction, a first printed circuit board including a first body part facing the first area in a second direction that is different from the first direction and a first extension part extending from the first body part, a second printed circuit board including a second body part facing the second area in the second direction and a second extension part extending from the second body part and facing the first extension part in the second direction, and a connecting flexible circuit board having one end connected to the first extension part and the other end connected to the second extension part.

20 Claims, 9 Drawing Sheets

(56) References Cited

U.S. PATENT DOCUMENTS

2011/0043105 A1* 2/2011 Cok .................. H01L 27/3248
  313/506
2011/0063261 A1* 3/2011 Park .................. G02F 1/13452
  345/204

* cited by examiner

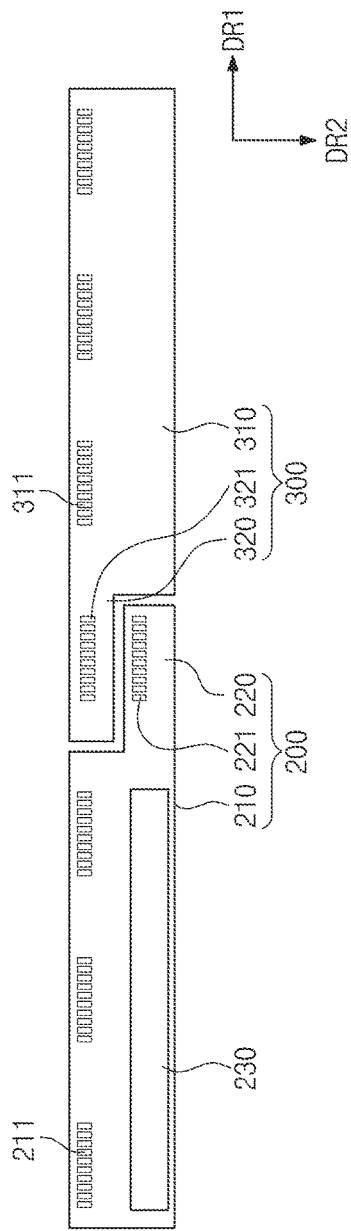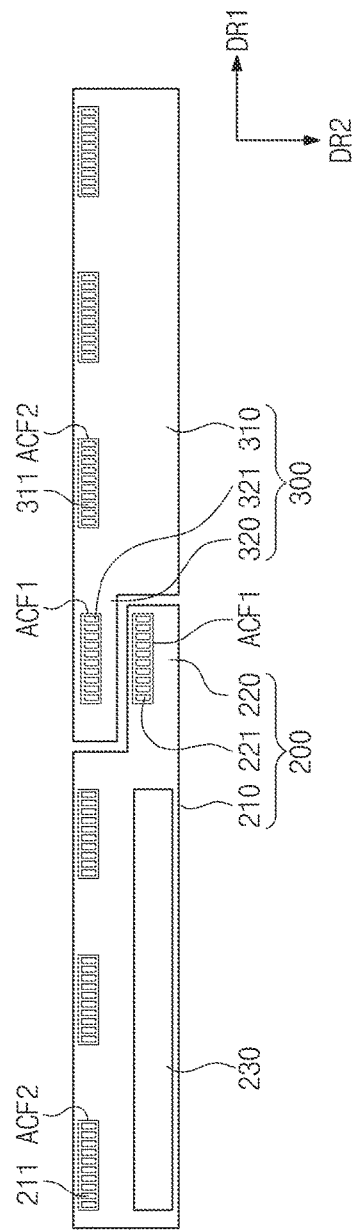

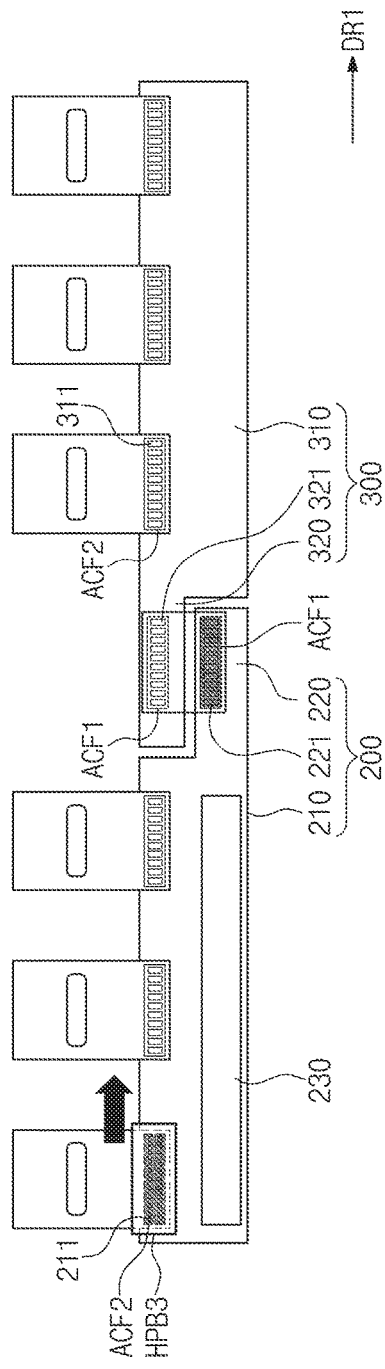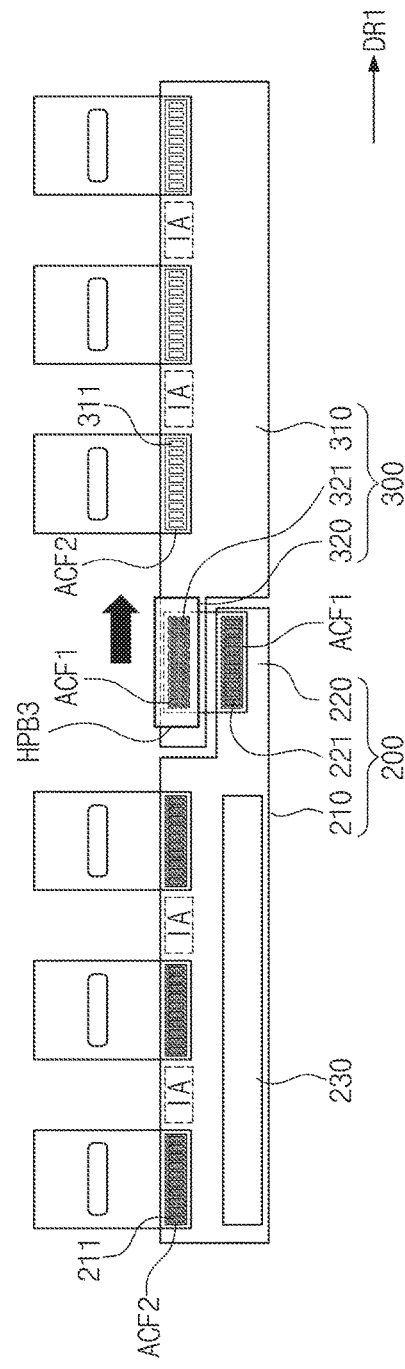

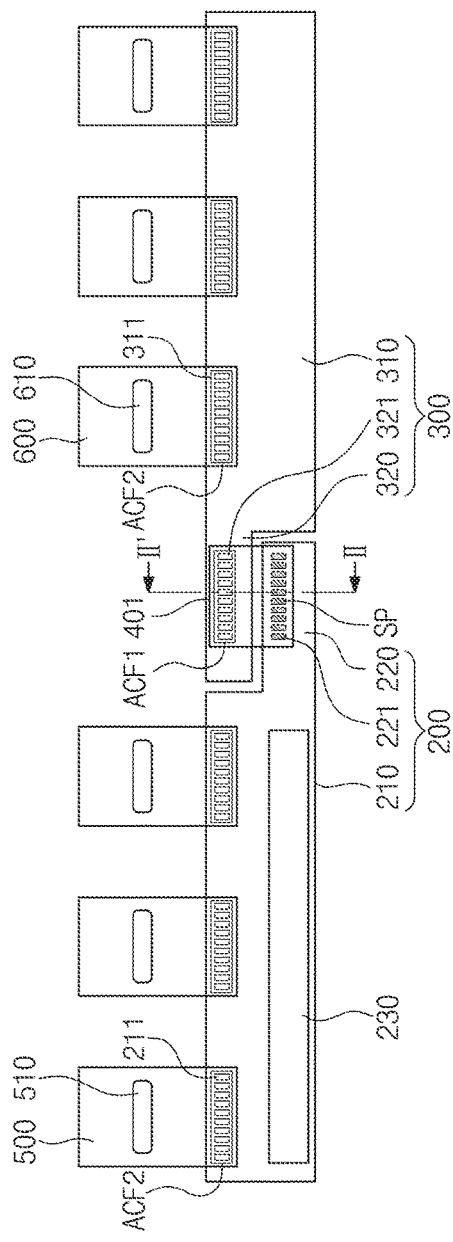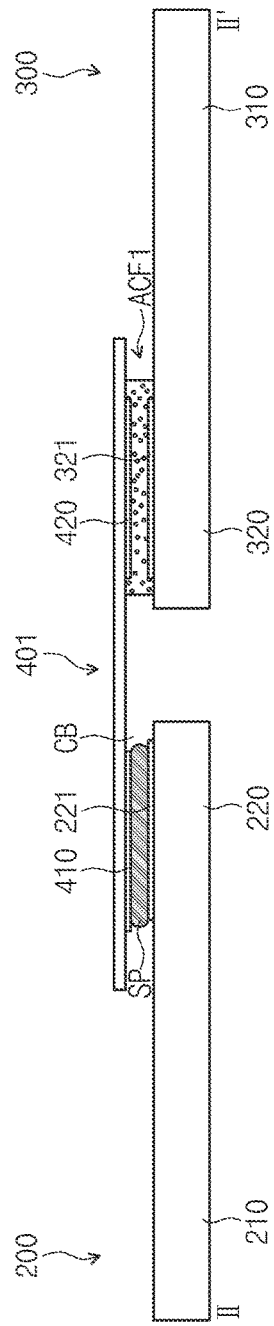

DISPLAY DEVICE AND METHOD FOR MANUFACTURING THE SAME

This application claims priority to Korean Patent Application No. 10-2015-0155941, filed on Nov. 6, 2015, and all the benefits accruing therefrom under 35 U.S.C. § 119, the content of which in its entirety is herein incorporated by reference.

BACKGROUND

1. Field

The disclosure herein relates to a display device and a method of manufacturing the display device, and more particularly, to a display device with reduced manufacturing cost and a method of manufacturing the display device having a simplified process.

2. Description of the Related Art

Various display devices are widely used in various devices such as televisions, mobile phones, navigation devices, computer monitors, and game consoles.

Such a display device typically includes a display panel for displaying an image and a control unit that generates various signals for driving the display panel. The control unit may include various circuits and electronic devices on a printed circuit board.

Since the display panel has a large area and high resolution, an amount of data to be processed by the control unit may increase, and thus, the circuits and devices for realizing the control unit may increase in size and number, respectively.

SUMMARY

The disclosure provides a display device with reduced manufacturing cost and a method of manufacturing the display device having a simplified process.

An embodiment of the inventive concept provides display devices including: a display panel on which a first area and a second area adjacent to the first area in a first direction are defined; a first printed circuit board including a first body part facing the first area in a second direction, which is different from the first direction, and a first extension part extending from the first body part; a second printed circuit board including a second body part facing the second area in the second direction and a second extension part extending from the second body part and facing the first extension part in the second direction; and a connecting flexible circuit board connected to the first extension part and the second extending part, where an end portion of the connecting flexible circuit board is connected to the first extension part, and an opposing end portion of the connecting flexible circuit board is connected to the second extension part.

In an embodiment, the first printed circuit board may further include a first connection pad part disposed on the first extension part, the second printed circuit board may further include a second connection pad part disposed on the second extension part, and the connecting flexible printed circuit board may include a third connection pad part connected to the first connection pad part and a fourth connection pad part connected to the second connection pad part by an anisotropic conductive film.

In an embodiment, the first to fourth connection pad parts may be arranged in the first direction.

In an embodiment, the first and second printed circuit boards may include first and second output pad parts, respectively, the display panel may include a first data line and a second data line, which are disposed in the first and second areas, respectively, the display devices may further include a first output flexible circuit board which connects the first output pad part to the first data line and a second output flexible circuit board which connects the second output pad part to the second data line, and the first and second output pad parts may face the second connection pad part in the first direction.

In an embodiment, the first and second output pad parts may be arranged in the first direction.

In an embodiment, the first output pad part may be disposed on the first body part, and the first extension part may extend from the first body part to the second body part, and the second output pad part may be disposed on the second body part, and the second extension part may extend from the second body part to the first body part.

In an embodiment, the first and second connection pad parts may face each other in the second direction.

In an embodiment, the first and third connection pad parts may be connected to each other by the anisotropic conductive film.

In an embodiment, the first and third connection pad parts may be connected to each other by a soldering part.

In an embodiment, the display devices may further include a first driver which drives a first data line, and a second data driver which drives a second data line, the display panel may include the first and second data lines, which are disposed in the first and second areas, respectively, where the first printed circuit board may include a control unit which generates and outputs first and second control signals to the first and second data drivers, respectively, and the second control signal may be outputted to the second data driver through the connecting flexible circuit board.

In an embodiment, the control unit may generate and output first and second image data to the first and second data drivers, respectively, and the second image data may be outputted to the second data driver through the connecting flexible circuit board.

In an embodiment, the control unit may generate and outputs first and second powers to the first and second data drivers, respectively, and the second power may be outputted to the second data driver through the connecting flexible circuit board.

In an embodiment, the connecting flexible circuit board may include a first connection line and a second connection line, and a width of the first connection line may be different from a width of the second connection line.

In an embodiment of the inventive concept, a method of manufacturing a display device includes: providing first and second printed circuit boards in a way such that a first extension part of the first printed circuit board faces a second extension part of the second printed circuit board in one direction; first connecting a first connection pad part disposed on the first extension part to an end portion of a connecting flexible circuit board; second connecting a second connection pad part disposed on the second extension part to an opposing end portion of the connecting flexible circuit board; third connecting a first output pad part disposed on a first body part of the first printed circuit board to an end portion of a first output flexible circuit board; providing the display panel in a way such that the first body part faces a first area of a display panel in the one direction, and a second body part of the second printed circuit board faces a second area of the display panel in the one direction; and fourth connecting the first output pad part to the first area.

In an embodiment, the second connecting may include: providing a first anisotropic conductive film on the second connection pad part; providing the opposing end portion of the connecting flexible circuit board on the first anisotropic conductive film; and performing a first thermal compression on the first anisotropic conductive film to connect the second connection pad part to the opposing end portion of the connecting flexible circuit board, and the third connecting may include: providing a second anisotropic conductive film on the first output pad part; providing the end portion of the first output flexible circuit board on the second anisotropic conductive film; and performing a second thermal compression on the second anisotropic conductive film to connect the first output pad part to the end portion of the first output flexible circuit board.

In an embodiment, the first thermal compression and the second thermal compression may be performed at substantially a same time.

In an embodiment, each of the performing the first and the performing the second thermal compression may include: disposing a thermal compression bar on each of a top surface of the opposing end portion of the connecting flexible circuit board and a top surface of the end portion of the first output flexible circuit board; and moving the thermal compression bar downward to thermally compress the first and second anisotropic conductive films.

In an embodiment, the performing the first thermal compression may include: disposing a thermal compression bar on a top surface of the opposing end portion of the connecting flexible circuit board; and moving the thermal compression bar downward to thermally compress the first anisotropic conductive film, and the performing the second thermal compression may include: moving the thermal compression bar to dispose the thermal compression bar on the top surface of the opposing end portion of the connecting flexible circuit board; and moving the thermal compression bar downward to thermally compress the second anisotropic conductive film.

In an embodiment, the first connecting may include soldering the first connection pad part to the end portion of the connecting flexible circuit board.

In an embodiment of the inventive concept, a display device includes: a display panel on which a first area and a second area adjacent to the first area in one direction are defined; a first output flexible circuit board including a first end portion connected to the first area; a second output flexible circuit board including a first end portion connected to the second area; a first printed circuit board including a plurality of first output pad parts connected to a second end portion of the first output flexible circuit board and arranged in the one direction, where the second end portion of the first output flexible circuit is opposite to the first end portion of the first output flexible circuit, and a plurality of first connection pad parts arranged in the one direction; a second printed circuit board including a plurality of second output pad parts connected to a second end portion of the second output flexible circuit board and arranged in the one direction, where the second end portion of the second output flexible circuit is opposite to the first end portion of the second output flexible circuit, and a plurality of second connection pad parts; and a connecting flexible circuit board which connects the first and second connection pad parts to each other.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain features of embodiments of the inventive concept. In the drawings:

FIGS. 4A to 4E are views showing a method of manufacturing the display device according to an embodiment of the inventive concept;

FIGS. 5A and 5B are views showing first and second thermal compression according to an alternative embodiment of the inventive concept;

FIG. 6A is a schematic plan view showing the connecting flexible circuit board according to an embodiment of the inventive concept;

FIG. 6B is a cross-sectional view taken along line II-II' of FIG. 6A; and

DETAILED DESCRIPTION

Figure 1:
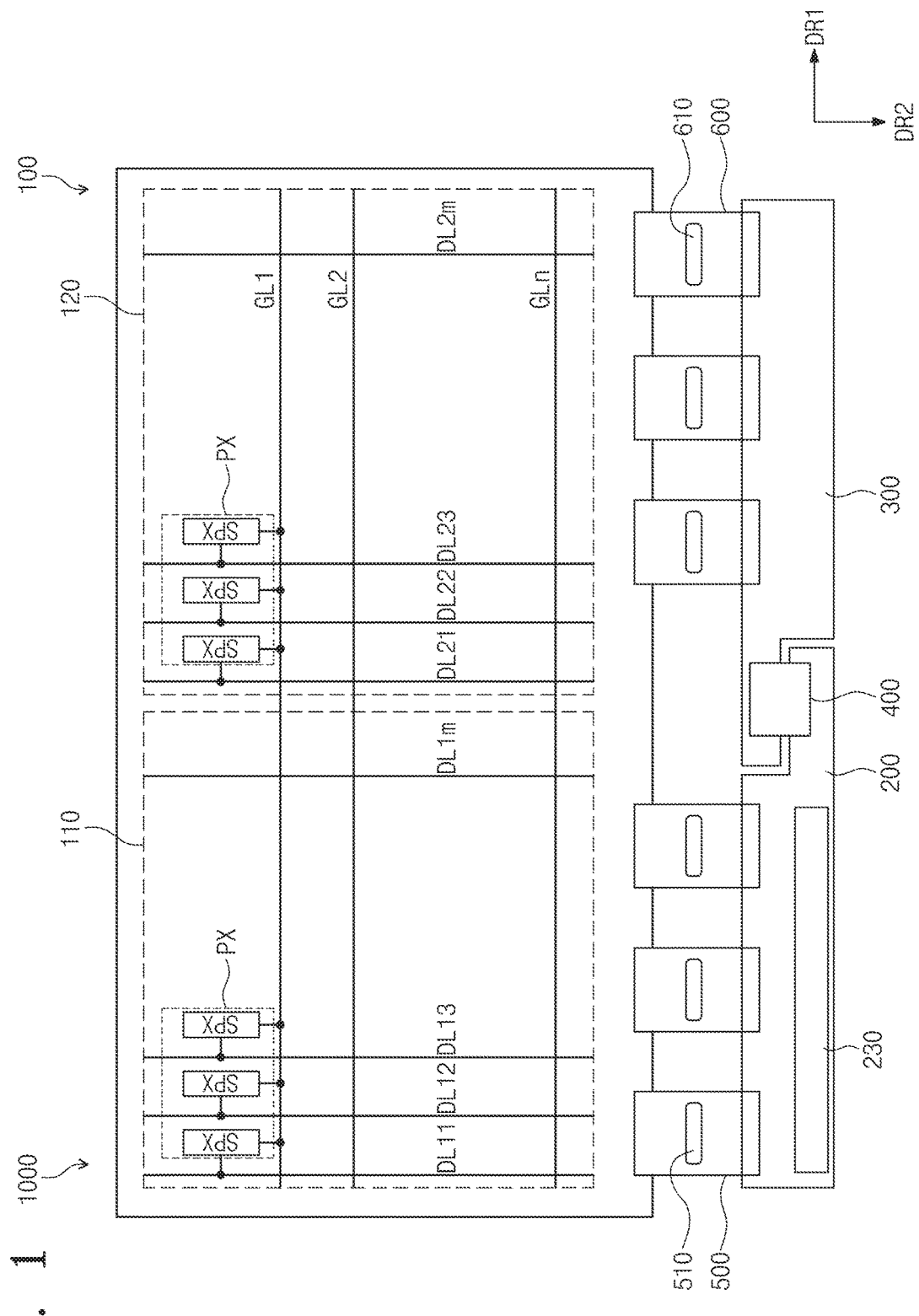
FIG. 1 is a schematic plan view of a display device according to an embodiment of the inventive concept.

Since the disclosure may have diverse modified embodiments, preferred embodiments are illustrated in the drawings and are described in the detailed description of the inventive concept. However, this does not limit the disclosure within specific embodiments and it should be understood that the disclosure covers all the modifications, equivalents, and replacements within the idea and technical scope of the inventive concept.

Like reference numerals refer to like elements throughout. In the drawings, the dimensions and size of each structure are exaggerated, omitted, or schematically illustrated for convenience in description and clarity. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings thereof.

The terminology used herein is for the purpose of describing particular embodiments only and is not intended to be limiting of the invention. As used herein, the singular forms, "a", "an" and "the" are intended to include the plural forms as well, unless the context clearly indicates otherwise. Or" means "and/or." As used herein, the term "and/or" includes any and all combinations of one or more of the associated listed items. The meaning of 'include' or 'comprise' specifies a property, a region, a fixed number, a step, a process, an element and/or a component but does not exclude other properties, regions, fixed numbers, steps, processes, elements and/or components.

In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the inventive concept will be described below in detail with reference to the accompanying drawings.

FIG. 1 is a schematic plan view of a display device according to an embodiment of the inventive concept.

Referring to FIG. 1, an embodiment of the display device 1000 includes first and second printed circuit boards 200 and 300 that are adjacent to each other in a first direction DR1 and a display panel 100 that is adjacent to the first and second printed circuit boards 200 and 300 in a second direction DR2 crossing (e.g., perpendicular to the first direction DR1.

In an embodiment of the inventive concept, the display panel 100 may include first and second areas 110 and 120. The first and second areas 110 and 120 are disposed adjacent to each other in the first direction DR1. The display panel 100 may be bisectionally divided into the first and second areas 110 and 120 by an imaginary line in the first direction DR1.

The display panel 100 may display an image through the first and second areas 110 and 120. The first and second areas 110 and 120 may be driven by control signals and image data which are supplied from the first and second printed circuit boards 200 and 300, respectively.

The display panel 100 includes gate lines GL1 to GLn, data lines, and sub pixels SPX. In one embodiment, for example, the gate lines GL1 to GLn may extend in the first direction DR1 and be arranged in the second direction DR2. The data lines are insulated from the gate lines GL1 to GLn and cross the gate lines GL1 to GLn. In one embodiment, for example, the data lines may extend in the second direction DR2 and be arranged in the first direction DR1. In an embodiment, as described above, the first and second directions DR1 and DR2 may be, for example, perpendicular to each other. The data lines include a plurality of first data lines DL11 to DL1*m* disposed in the first area 110 and a plurality of second data lines DL21 to DL2*m* disposed in the second area 120.

Each of the sub pixels SPX is connected to a corresponding gate line of the gate lines GL1 to GLn and a corresponding data line of the data lines.

The sub pixels SPX may be arranged in a matrix form along the first and second directions DR1 and DR2. The sub pixels SPX may express one of primary colors such as red, green, and blue colors, for example, but the colors expressed by the sub pixels SPX are not limited thereto. In an alternative embodiment, the sub pixels SPX may express various colors, e.g., secondary primary colors such as a white or yellow color, cyan, and magenta in addition to the red, green, and blue colors.

The sub pixels SPX may constitute a pixel PX. In one embodiment, for example, three sub pixels SPX may constitute one pixel PX. However, an embodiment of the inventive concept is not limited thereto. In one alternative embodiment, for example, two, four, or more sub pixels SPX may constitute one pixel PX.

The pixel PX may be a device for displaying a unit image. The display panel 100 may have resolution that is determined by the number of pixels PX provided on the display panel 100. For convenience of illustration, only two pixels PX are illustrated in FIG. 1, and rest pixels were omitted.

The display device 1000 includes a connecting flexible circuit board 400, a plurality of first output flexible circuit boards 500 and a plurality of second output flexible circuit boards 600. The connecting flexible circuit board 400 connects the first and second printed circuit boards 200 and 300 to each other. The first output flexible circuit board 500 connects the first printed circuit board 200 to the first area 110, and the second output flexible circuit board 600 connects the second printed circuit board 300 to the second area 120.

Each of the first and second output flexible circuit boards 500 and 600 may extend in the second direction DR2 and be arranged in the first direction DR1.

In an embodiment of the inventive concept, the first output flexible circuit board 500 may include a first driving chip 510. The first driving chip 510 may be disposed or mounted on the first output flexible circuit board 50 as, for example, a tape carrier package ("TCP"). The first driving chip 510 may include a chip that defines or constitutes a first data driver (not shown). In an embodiment of the inventive concept, the second output flexible circuit board 600 may include a second driving chip 520. The second driving chip 520 may be mounted on the second output flexible circuit board 600 as, for example, TCP. The second driving chip 600 may include a chip that defines or constitutes a second data driver (not shown). The first and second driving chips 510 and 520 may further include a chip that defines or constitutes a gate driver.

The first printed circuit board 200 may include a control unit 230. The control unit 230 receives input image signals (not shown) and convert data format of the input image signals to match interface specifications of the first and second data drivers to generate the image data. The control unit 230 outputs the image data and the control signal. The image data includes first and second image data having information with respect to images to be displayed on the first and second areas 110 and 120, respectively. The control signal includes first and second data control signals for controlling the first and second image data, respectively.

The first and second data drivers receive the first and second image data, respectively. The first and second data drivers receive the first and second data control signals, respectively. The first and second data drivers convert the first and second image data into first and second data voltages in response to the first and second data control signals to output the first and second data voltages to the first and second data lines DL11 to DL1*m* and DL21 to DL2*m*, respectively. Each of the first and second data voltages may be an analog voltage.

In such an embodiment, the control unit 230 may generate first and second power that are used for driving the first and second data drivers and provide the first and second power to the first and second data drivers, respectively.

In an embodiment of the inventive concept, the pixel may include an organic light emitting device. In an embodiment, where the display panel 100 is an organic light emitting display panel, the first and second power may include power voltages for driving the organic light emitting device of the pixel PX disposed in the first and second areas 110 and 120.

In an alternative embodiment of the inventive concept, the pixel may include a liquid crystal layer and a color filer. In such an embodiment, the display panel 100 may be a liquid crystal display panel, and the display device 1000 may include a backlight unit disposed at a rear side of the display panel 100.

Figure 2A:
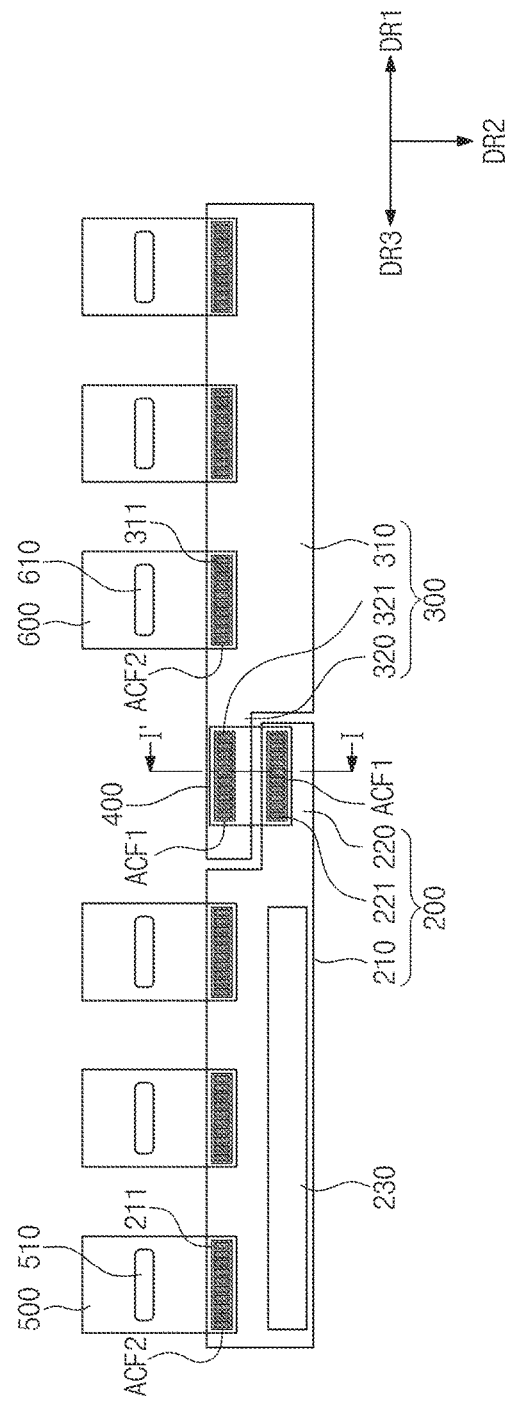
FIG. 2A is an enlarged plan view of first and second printed circuit boards of FIG. 1.
Figure 2B:
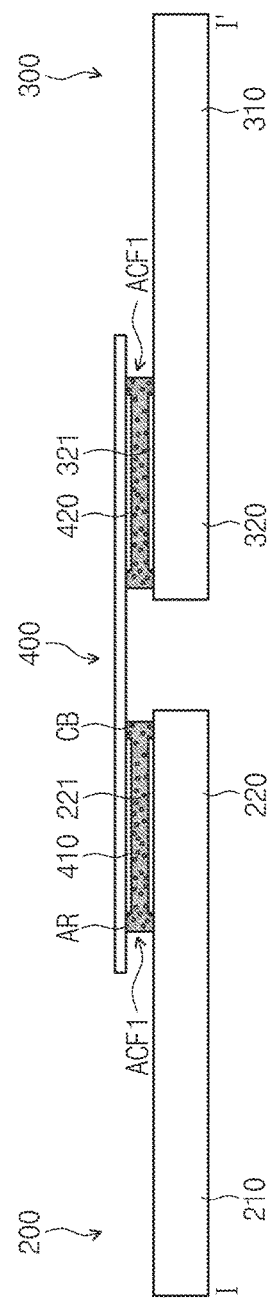
FIG. 2B is a cross-sectional view taken along line I-I' of FIG. 2A.

FIG. 2A is an enlarged plan view of the first and second printed circuit boards of FIG. 1, and FIG. 2B is a cross-sectional view taken along line I-I' of FIG. 2A.

Referring to FIG. 2A, the first printed circuit board 200 includes a first body part 210 and a first extension part 220 extending from the first body part 210. In an embodiment of the inventive concept, the first extension part 220 may extend from an end of the first body part 210 to the second printed circuit board 300. In such an embodiment, the first extension part 220 may extend in the first direction DR1.

The first printed circuit board 200 may include a plurality of first connection pad parts 221 disposed on the first extension part 220. The plurality of first connection pad parts 221 may be arranged in the first direction DR1.

The first printed circuit board 200 may include a plurality of output pad parts 211 disposed on the first body part 210. The plurality of first output pad parts 211 may be arranged in the first direction DR1. The plurality of first output pad parts 211 may be disposed to correspond to the plurality of first output flexible circuit boards 500.

The second printed circuit board 300 includes a second body part 310 and a second extension part 320 extending from the second body part 310. In an embodiment of the inventive concept, the second extension part 320 may extend from an end of the second body part 310 to the first printed circuit board 200. In such an embodiment, the second extension part 320 may extend in a third direction DR3 that is opposite to the first direction DR1.

The second printed circuit board 300 may include a plurality of second connection pad parts 321 disposed on the second extension part 320. The plurality of second connection pad parts 321 may be arranged in the first direction DR1.

The second printed circuit board 300 may include a plurality of output pad parts 311 disposed on the second body part 310. The plurality of second output pad parts 311 may be arranged in the first direction DR1. The plurality of second output pad parts 311 may be disposed to correspond to the plurality of second output flexible circuit boards 600.

The first and second extension parts 220 and 320 may face each other in the second direction DR2. The plurality of second connection pad parts 321 may respectively face the plurality of first connection pad parts 211 in the second direction DR2.

In an embodiment of the inventive concept, the plurality of second connection pad parts 321 may face the first and second output pad parts 211 and 311, respectively, in the first or third direction DR1 or DR3. In an embodiment, the plurality of second connection pad parts 321 may be linearly disposed, or arranged along a same line, with the first and second output pad parts 211 and 311, as shown in FIG. 2A.

In an embodiment, as described above, the connecting flexible circuit board 400 connects the first and second printed circuit boards 200 and 300 to each other. In such an embodiment, the connecting flexible circuit board 400 may have an end (or a first end) and an opposing end (or a second end), which are respectively connected to the first and second extension parts 220 and 320.

As illustrated in FIG. 2B, in an embodiment of the inventive concept, the connecting flexible circuit board 400 includes third and fourth connection pad parts 410 and 420. The third and fourth connection pad parts 410 and 420 are disposed opposite to the first and second connection pad parts 221 and 321, respectively, in a thickness direction of the connecting flexible circuit board 400.

In an embodiment of the inventive concept, a first anisotropic conductive film ACF1 may be disposed to correspond between the first and third connection pad parts 221 and 410 and between the second and fourth connection pad parts 321 and 420. The first anisotropic conductive film ACF1 may electrically connect the first and third connection pad parts 221 and 410 to each other, and the first anisotropic conductive film ACF1 may electrically connect the second and fourth connection pad parts 321 and 420 to each other. The first anisotropic conductive film ACF1 may include an adhesion resin AR and a plurality of conductive balls CB that are disposed (e.g., dispersed or scattered) in the adhesion resin AR.

The first and second output pad parts 211 and 311 may be respectively connected to first end (or side) portions of the first and second output flexible circuit boards 500 and 600 through a second anisotropic conductive film ACF2. The second anisotropic conductive film ACF2 may be disposed between the plurality of first output pad parts 211 and the first end portion of the first output flexible circuit board 500 and between the plurality of second output pad parts 311 and the first end portion of the second output flexible circuit board 600.

In an embodiment, the second image data and the second data control signal, which are generated in the control unit 230 may be outputted to the plurality of first connection pad parts 221 through a line (not shown) disposed on the first printed circuit board 200. Then, the second image data and the second data control signal may successively pass through the plurality of third connection pad parts 410, the plurality of fourth connection pad parts 420, the plurality of second connection pad parts 321, and the plurality of second output pad parts 311 and then be provided to the second driving chip 610.

In such an embodiment, the first image data and the first data control signal, which are generated in the control unit 230 may be outputted to the plurality of first output pad parts 211 through a line (not shown) disposed on the first printed circuit board 200 and then provided to the first driving chip 510.

In an embodiment, as described above, the first and second extension parts 220 and 320 may face each other in the second direction DR2. Thus, as described below, the process of connecting the first and second connection pad parts 221 and 321 to each other may be simplified, and also, the connection structure between the first and second printed circuit boards may be simplified. In such an embodiment, the process of connecting the first and second connection pads 221 and 321 to each other may be performed at the same time or during a same process as on lead bonding ("OLB") of connecting the first and second output flexible circuit boards 500 and 600 to each other.

Figure 3:
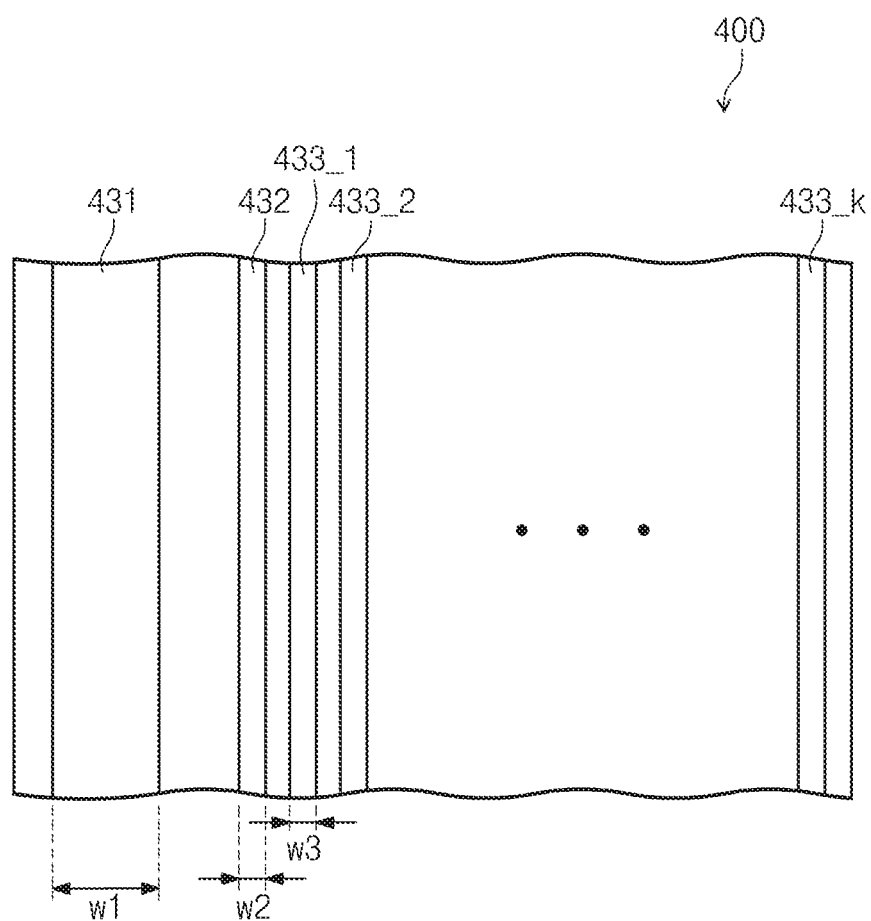
FIG. 3 is a schematic partial plan view of a connecting flexible circuit board of FIG. 2A.

FIG. 3 is a schematic partial plan view of a connecting flexible circuit board of FIG. 2A.

Referring to FIG. 3, in an embodiment, the connecting flexible circuit board 400 may include a plurality of connection lines. The plurality of connection lines may each have an end connected to the plurality of third connection pad parts 410 and an opposing end connected to the plurality of fourth connection pads 420.

In an embodiment of the inventive concept, the plurality of connection lines may include a first connection line 431, a second connection line 432 and third connection lines 433_1 to 433_k. In one embodiment, for example, the first to third connection lines 431, 432, and 433_1 to 433_k may transmit the second power, the second data control signal, and the second image data, respectively. In an embodiment of the inventive concept, to effectively transmit the large amount of second image data, the third connection lines 433_1 to 433_k may include a plurality of lines, e.g., k lines, where k is a natural number equal to or greater than 2.

The first to third 431, 432, and 433_1 to 433_k may have first to third widths w1, w2, and w3, respectively. At least one of the first to third widths w1, w2, and w3 may be different from each other. In an embodiment of the inventive concept, the first to third widths w1, w2, and w3 may be adjusted based on characteristics of signals or power that are transmitted through the first to third connection lines 431, 432, and 433_1 to 433_k.

In one embodiment, for example, where the first connection line 431 transmits the second power having relatively large power, the first connection line 431 may have a width greater than that of each of the second and third connection lines 432, and 433_1 to 433_k for transmitting the second data signal and the second image data, which have relatively low power.

FIGS. 4A to 4E are views showing a method of manufacturing the display device according to an embodiment of the inventive concept.

In an embodiment, as illustrated in FIG. 4A, the first and second printed circuit boards 200 and 300 are disposed. In such an embodiment, the first and second printed circuit boards 200 and 300 are aligned with each other in a way such that the first and second printed circuit boards 200 and 300 are adjacent to each other in the first direction DR1, and the first and second extension parts 220 and 320, which are defined by protruded portions of the first and second printed circuit boards 200 and 300 extending in the first direction DR1, are disposed adjacent to each other in the second direction DR2.

In such an embodiment, as illustrated in FIG. 4B, the first anisotropic conductive film ACF1 is provided on the first and second connection pad parts 221 and 321. The first anisotropic conductive film ACF1 may cover the first and second connection pad parts 221 and 321. The second anisotropic conductive film ACF2 is provided on the first and second output pad parts 211 and 311. The second anisotropic conductive film ACF2 may cover the first and second output pad parts 211 and 311.

Figure 4C:
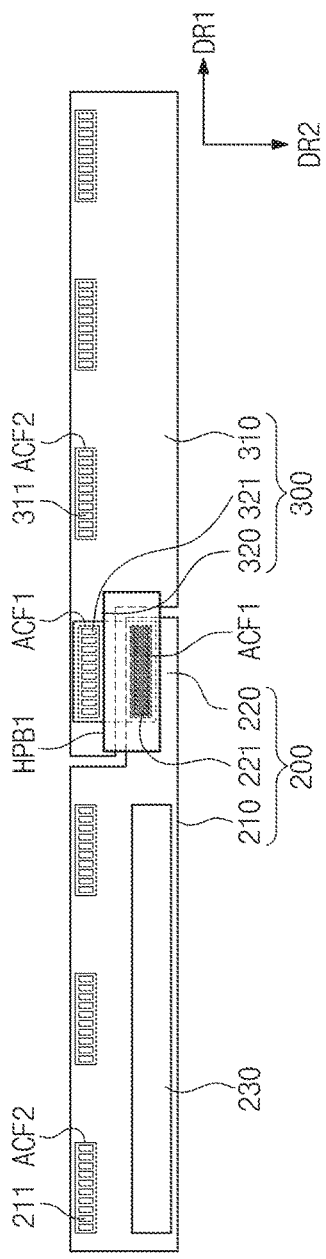
Figure 4D:
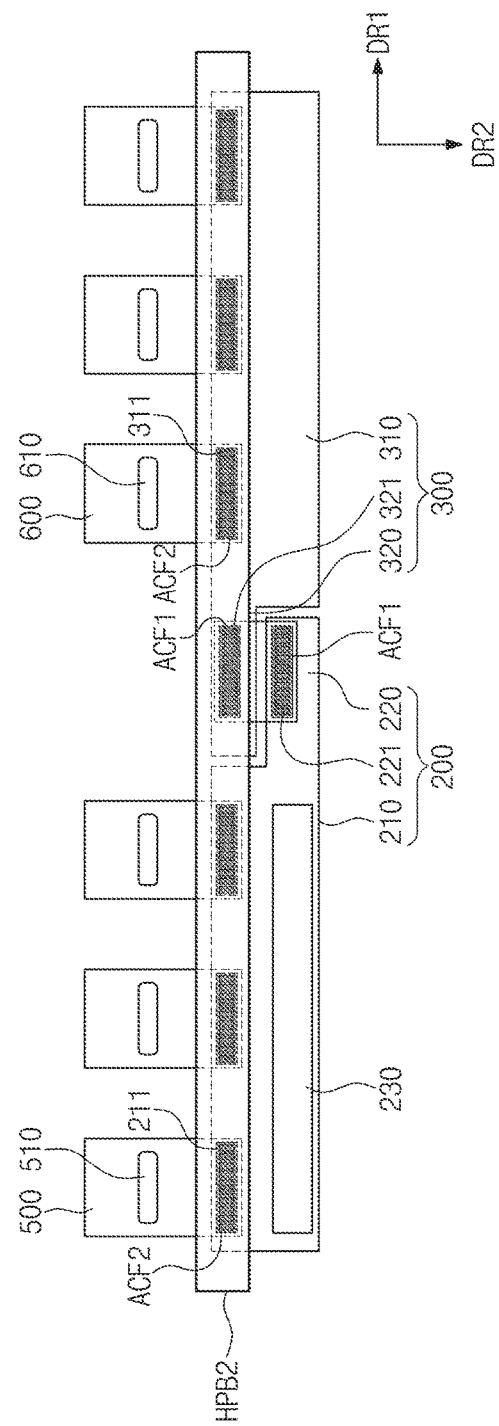
Figure 4E:
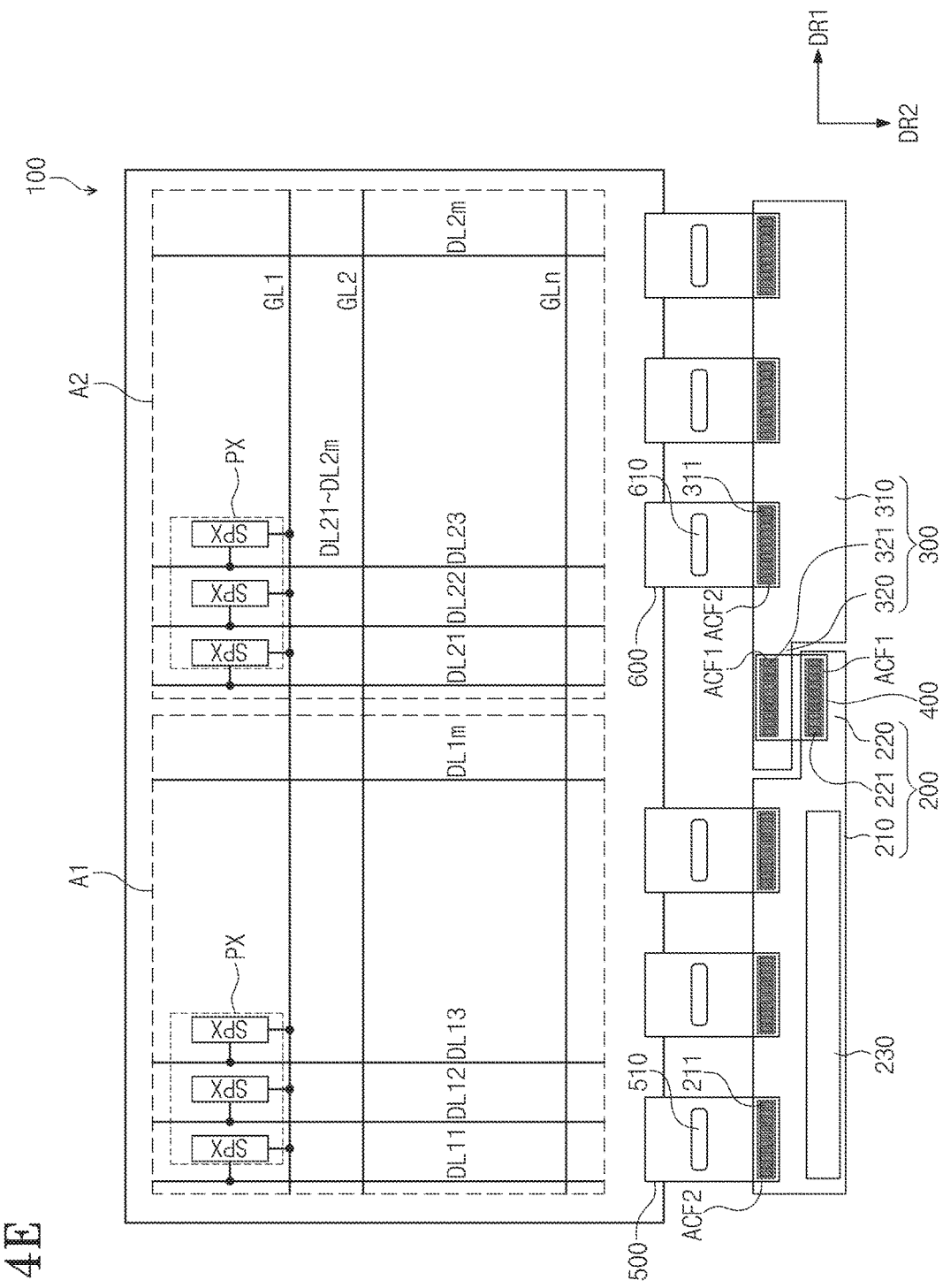

In such an embodiment, as illustrated in FIG. 4C, the connecting flexible circuit board 400 has an end (or a side portion) facing the plurality of first connection pad parts 221 in a direction that is perpendicular to the plurality of first connection pad parts 221. A first thermal compression bar HPB1 is disposed on a top surface of an end portion of the connecting flexible circuit board 400 and then descends (e.g., is moved or pressed) downward. To connect the first connection pad part 221 to the end portion of the connecting flexible circuit board 400, the first thermal compression bar HPB1 performs first thermal compression on the first anisotropic conductive film ACF1. In FIGS. 4C to 4E, the thermally compressed anisotropic conductive film was illustrated through hatching (or shading).

In such an embodiment, as illustrated in FIG. 4D, an end portion of each of the plurality of first output flexible circuit boards 500 is disposed on or to overlap a corresponding one of the plurality of first output pad parts 211, and an end portion of each of the plurality of second output flexible circuit boards 600 is disposed on a corresponding one of the plurality of second output pad parts 311. In such an embodiment, an opposing end (or an opposing side portion) of the connecting flexible circuit board 400 is disposed on or to overlap the plurality of second connection pad parts 321. Here, the end and the opposing end portion of the connecting flexible circuit board 400 may be end portions opposite to each other in the second direction DR2.

In such an embodiment, as illustrated in FIG. 4D, a second thermal compression bar HPB2 is disposed on or to overlap an end (or a side portion) of each of the first and second output flexible circuit boards 500 and 600. In an embodiment of the inventive concept, the second thermal compression bar HPB2 may have a rod shape that extends in the first direction DR1. The second thermal compression bar HPB2 is disposed on or to overlap the opposing end portion of the connecting flexible circuit board 400. In such an embodiment, the second thermal compression bar HPB2 perpendicularly faces the first and second output flexible circuit boards 500 and 600 and the opposing end portion of the connecting flexible circuit board 400.

The second thermal compression bar HPB2 descends (or is moved or pressed) downward. To connect the second connection pad part 321 to the other end portion of the connecting flexible circuit board 400, the second thermal compression bar HPB2 performs the first thermal compression on the first anisotropic conductive film ACF1. Simultaneously, second thermal compression may be performed on the second anisotropic conductive film ACF2, and the first and second output pad parts 211 and 311 may be respectively connected to the first and second output flexible circuit boards 500 and 600. Accordingly, in such an embodiment, the first and second thermal compression may be performed at the same time during a same process.

In such an embodiment, as illustrated in FIG. 4E, the first and second areas 110 and 120 of the display panel 100 are disposed to face the first and second printed circuit boards 200 and 300 in the second direction DR2.

In an embodiment, an end portion of the first output flexible circuit board 500, which is disposed to overlap the display panel 100, is connected to a plurality of first panel pad parts (not shown) that are adjacent to the first area 110 so that the first output flexible circuit board 500 is connected to the plurality of first data lines DL11 to DL1m. In such an embodiment, an end portion of the second output flexible circuit board 600, which is disposed to overlap the display panel 100, is connected to a plurality of second panel pad parts (not shown) that are adjacent to the second area 120 so that the second output flexible circuit board 600 is connected to the plurality of second data lines DL21 to DL2m.

In an embodiment, as described above, the connecting flexible circuit board 400 may be connected through the process of connecting the first and second output flexible circuit boards 500 and 600 to each other. In such an embodiment, since the second connection pad part 321 is disposed to face the first and second output pad parts 211 and 311 in the first direction DR1, the first thermal compression and the second thermal compression may be performed at the same time through the second thermal compression bar HPB2 that is used for the second thermal compression.

Thus, in such an embodiment, the process of connecting the connecting flexible circuit board 400 may be simplified and also reduced in process cost.

FIGS. 5A and 5B are views showing first and second thermal compression according to an alternative embodiment of the inventive concept.

Referring to FIG. 5A, in an embodiment, the first and second thermal compression may be performed through a third thermal compression bar HPB3.

In such an embodiment, the third thermal compression bar HPB3 is disposed on an end portion of the leftmost first output flexible circuit board 500. In an embodiment of the inventive concept, the third thermal compression bar HPB3 has a rod shape that extends in the first direction DR1. A width of the third thermal compression bar HPB3 in the first direction DR1 may be substantially the same as that of the second anisotropic conductive film ACF2.

The third thermal compression bar HPB3 descends (or is moved or pressed) downward. The third thermal compression bar HPB3 performs the first thermal compression on the leftmost second anisotropic conductive film ACF2.

Thereafter, the third thermal compression bar HPB3 may move in the first direction DR1 to perform the first thermal compression on next second anisotropic conductive films to connect the first output flexible circuit boards 500 corresponding thereto.

Then, referring to FIG. 5B, the third thermal compression bar HPB3 performs the second thermal compression on the first anisotropic conductive film ACF1 disposed on the plurality of second connection pad part 321 to connect an opposing end portion of the connecting flexible circuit board 400.

In such an embodiment, the third thermal compression bar HPB3 performs the first compression on the rest second anisotropic conductive film ACF2 to connect the second output flexible circuit board 600 while moving in the first direction DR1.

In such an embodiment, as described above, the process using the third thermal compression bar HPB3 may have accuracy that is higher than that of the process using the second thermal compression bar HPB2. In such an embodiment, where a device is disposed on an intermediate area IA between the plurality of first output pad parts 211, the first and second thermal compression may be performed without damaging the device disposed on the intermediate area IA.

FIG. 6A is a schematic plan view showing the connecting flexible circuit board according to an embodiment of the inventive concept, and FIG. 6B is a cross-sectional view taken along line II-II' of FIG. 6A.

The connecting flexible circuit board 401 of FIGS. 6A and 6B may be the same as the connecting flexible circuit board 400 of FIGS. 2A and 2B except that an end portion of the connecting flexible circuit board 401 is connected through soldering. The same or like elements shown in FIGS. 6A and 6B have been labeled with the same reference characters as used above to describe the embodiments of the connecting flexible circuit board shown in FIGS. 2A and 2B, and any repetitive detailed description thereof will hereinafter be omitted or simplified.

Referring to FIGS. 6A and 6B, in an embodiment, the plurality of first connection pad parts 221 and the end portion of the connecting flexible circuit board 401 may be connected to each other through the soldering. In such an embodiment, a soldering part SP including a soldering material is disposed between the plurality of first connection pad parts 221 and the end portion of the connecting flexible circuit board 401. The soldering part SP may be provided in plurality to one-to-one correspond to the plurality of connection pad parts 221. The plurality of first connection pad parts 221 may be insulated from each other.

Figure 7A:
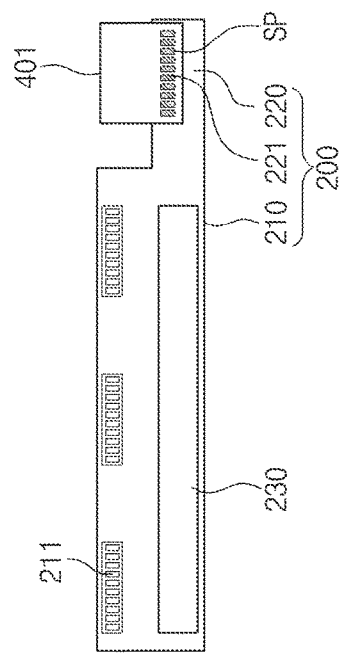
FIGS. 7A and 7B are views showing a method of manufacturing the display device according to alternative embodiment of the inventive concept.
Figure 7B:
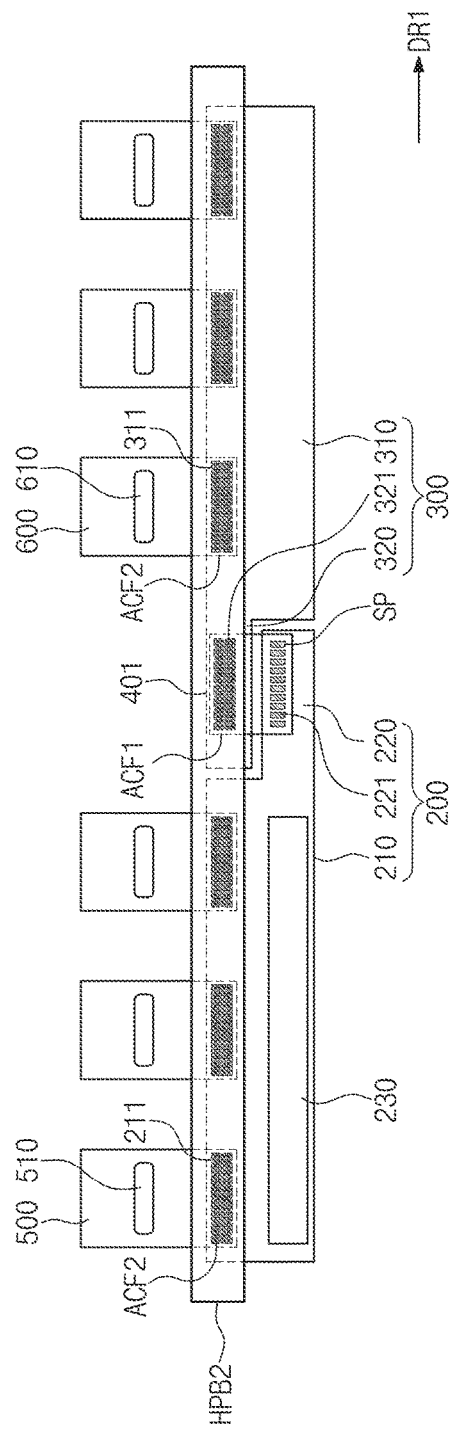

FIGS. 7A and 7B are views showing a method of manufacturing the display device according to an alternative embodiment of the inventive concept.

Referring to FIG. 7A, in an embodiment, an end portion of the flexible circuit board 401 is disposed on the plurality of first connection pad parts 221. In such an embodiment, a soldering material is disposed between the plurality of first connection pad parts 221 and the end portion of the connecting flexible circuit board 401 to solder the soldering material, thereby forming the soldering part SP.

Then, as illustrated in FIG. 7B, the second printed circuit board 300 is disposed adjacent to the first printed circuit board 200 in the first direction DR1. The first and second output flexible circuit boards 500 and 600, and the other end portion of the connecting flexible circuit board 400 are thermally compressed to perform the first and second thermal compression.

In such an embodiment, where the soldering is used as described above, since the end portion of the connecting flexible circuit board 400 is soldered together while the devices of the control unit 230 are soldered, the process of connecting the connecting flexible circuit board 400 may be simplified.

In such an embodiment, when the process for manufacturing the first and second printed circuit boards 200 and 300 and the first and second thermal compression processes are timely or spatially separated from each other, since the end portion of the connecting flexible circuit board 400 is firstly connected in the process for manufacturing the first and second printed circuit boards 200 and 300, the following first and second thermal compression processes may be efficiently performed.

According to the embodiment of the inventive concept as described herein, the first and second printed circuit boards may be designed in a way such that the process of connecting the connecting flexible circuit board is performed in the process of connecting the first and second output flexible circuit boards to each other. Therefore, the process of connecting the first and second printed circuit boards to each other may be reduced in process time and cost.

It will be apparent to those skilled in the art that various modifications and variations can be made in the invention. Thus, it is intended that the invention covers the modifications and variations of this invention provided they come within the scope of the appended claims and their equivalents.

Hence, the real protective scope of the inventive concept shall be determined by the technical scope of the accompanying claims.

What is claimed is:

1. A display device comprising:
   a display panel on which a first area and a second area adjacent to the first area in a first direction are defined;
   a first printed circuit board comprising:
      a first body part facing the first area in a second direction, which is different from the first direction; and
      a first extension part extending from the first body part;
   a second printed circuit board comprising:
      a second body part facing the second area in the second direction; and
      a second extension part extending from the second body part and facing the first extension part in the second direction; and
   a connecting flexible circuit board connected to the first extension part and the second extending part,
   wherein an end portion of the connecting flexible circuit board is connected to the first extension part and an opposing end portion of the connecting flexible circuit board is connected to the second extension part, and wherein the first extension part and the second extension part overlap and are spaced apart from each other in the second direction.

2. The display device of claim 1, wherein
the first printed circuit board further comprises a first connection pad part disposed on the first extension part,
the second printed circuit board further comprises a second connection pad part disposed on the second extension part, and
the connecting flexible printed circuit board comprises:
a third connection pad part connected to the first connection pad part; and
a fourth connection pad part connected to the second connection pad part by an anisotropic conductive film.

3. The display device of claim 2, wherein the first to fourth connection pad parts are arranged in the first direction.

4. The display device of claim 3, wherein
the first and second printed circuit boards comprise first and second output pad parts, respectively,
the display panel comprises a first data line and a second data line, which are disposed in the first and second areas, respectively,
the display device further comprises:
a first output flexible circuit board which connects the first output pad part to the first data line; and
a second output flexible circuit board which connects the second output pad part to the second data line, and
the first and second output pad parts face the second connection pad part in the first direction.

5. The display device of claim 4, wherein the first and second output pad parts are arranged in the first direction.

6. The display device of claim 4, wherein
the first output pad part is disposed on the first body part,
the first extension part extends from the first body part to the second body part,
the second output pad part is disposed on the second body part, and
the second extension part extends from the second body part to the first body part.

7. The display device of claim 2, wherein the first and second connection pad parts face each other in the second direction.

8. The display device of claim 2, wherein the first and third connection pad parts are connected to each other by the anisotropic conductive film.

9. The display device of claim 2, wherein the first and third connection pad parts are connected to each other by a soldering part.

10. The display device of claim 1, further comprising:
a first driver which drives a first data line; and
a second data driver which drives a second data line,
the display panel comprises the first and second data lines, which are disposed in the first and second areas, respectively,
wherein the first printed circuit board comprises a control unit which generates and outputs a first control signal and a second control signal to the first and second data drivers, respectively, and
the second control signal is outputted to the second data driver through the connecting flexible circuit board.

11. The display device of claim 10, wherein
the control unit generates and outputs first and second image data to the first and second data drivers, respectively, and
the second image data is outputted to the second data driver through the connecting flexible circuit board.

12. The display device of claim 10, wherein
the control unit generates and outputs first and second powers to the first and second data drivers, respectively, and
the second power is outputted to the second data driver through the connecting flexible circuit board.

13. The display device of claim 1, wherein
the connecting flexible circuit board comprises a first connection line and a second connection line, and
a width of the first connection line is different from a width of the second connection line.

14. A method of manufacturing a display device, the method comprising:
providing first and second printed circuit boards in a way such that a first extension part of the first printed circuit board faces a second extension part of the second printed circuit board in one direction, wherein the first extension part and the second extension part overlap and are spaced apart from each other in the one direction;
first connecting a first connection pad part disposed on the first extension part to an end portion of a connecting flexible circuit board;
second connecting a second connection pad part disposed on the second extension part to an opposing end portion of the connecting flexible circuit board;
third connecting a first output pad part disposed on a first body part of the first printed circuit board to an end portion of a first output flexible circuit board;
providing the display panel in a way such that the first body part faces a first area of a display panel in the one direction, and a second body part of the second printed circuit board faces a second area of the display panel in the one direction; and
fourth connecting the first output pad part to the first area.

15. The method of claim 14, wherein
the second connecting comprises:
providing a first anisotropic conductive film on the second connection pad part;
providing the opposing end portion of the connecting flexible circuit board on the first anisotropic conductive film; and
performing a first thermal compression on the first anisotropic conductive film to connect the second connection pad part to the opposing end portion of the connecting flexible circuit board, and
the third connecting comprises:
providing a second anisotropic conductive film on the first output pad part;
providing the end portion of the first output flexible circuit board on the second anisotropic conductive film; and
performing a second thermal compression on the second anisotropic conductive film to connect the first output pad part to the end portion of the first output flexible circuit board.

16. The method of claim 15, wherein the first thermal compression and the second thermal compression are performed at substantially a same time.

17. The method of claim 16, wherein each of the performing the first thermal compression and the performing the second thermal compression comprises:
disposing a thermal compression bar on each of a top surface of the opposing end portion of the connecting flexible circuit board and a top surface of the end portion of the first output flexible circuit board; and moving the thermal compression bar downward to thermally compress the first and second anisotropic conductive films.

18. The method of claim 15, wherein
the performing the first thermal compression comprises:
   disposing a thermal compression bar on a top surface of the opposing end portion of the connecting flexible circuit board; and
   moving the thermal compression bar downward to thermally compress the first anisotropic conductive film, and
the performing the second thermal compression comprises:
   moving the thermal compression bar to dispose the thermal compression bar on the top surface of the opposing end portion of the connecting flexible circuit board; and
   moving the thermal compression bar downward to thermally compress the second anisotropic conductive film.

19. The method of claim 15, wherein the first connecting comprises soldering the first connection pad part to the end portion of the connecting flexible circuit board.

20. A display device comprising:
   a display panel on which a first area and a second area adjacent to the first area in one direction are defined;
   a first output flexible circuit board including a first end portion connected to the first area;
   a second output flexible circuit board including a first end portion connected to the second area;
   a first printed circuit board comprising:
      a plurality of first output pad parts connected to a second end portion of the first output flexible circuit board and arranged in the one direction, wherein the second end portion of the first output flexible circuit is opposite to the first end portion of the first output flexible circuit; and
      a plurality of first connection pad parts arranged in the one direction;
   a second printed circuit board comprising:
      a plurality of second output pad parts connected to a second end portion of the second output flexible circuit board and arranged in the one direction, wherein the second end portion of the second output flexible circuit is opposite to the first end portion of the second output flexible circuit; and
      a plurality of second connection pad parts; and
   a connecting flexible circuit board which connects the first and second connection pad parts to each other,
   wherein a portion of the first printed circuit board and the first connection pad parts form a first extension toward the second printed circuit board;
   wherein a portion of the second printed circuit board and the second connection pad parts form a second extension toward the first printed circuit board; and
   wherein the first extension and the second extension overlap and are spaced apart from each other in a second direction.

* * * * *